(12) United States Patent
Kotani et al.

(10) Patent No.: US 10,032,899 B2
(45) Date of Patent: Jul. 24, 2018

(54) SEMICONDUCTOR DEVICE AND METHOD THEREFOR INCLUDING MULTIPLE CAP LAYERS WITH AMORPHOUS LAYER

(71) Applicant: FUJITSU LIMITED, Kawasaki-shi, Kanagawa (JP)

(72) Inventors: Junji Kotani, Atsugi (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/276,023

(22) Filed: Sep. 26, 2016

(65) Prior Publication Data

US 2017/0125564 A1    May 4, 2017

(30) Foreign Application Priority Data

Oct. 29, 2015  (JP) ................................ 2015-213395

(51) Int. Cl.
*H01L 29/778*  (2006.01)
*H01L 29/66*  (2006.01)
*H01L 29/20*  (2006.01)

(52) U.S. Cl.
CPC ...... *H01L 29/7787* (2013.01); *H01L 29/2003* (2013.01); *H01L 29/66462* (2013.01)

(58) Field of Classification Search
None
See application file for complete search history.

(56) References Cited

U.S. PATENT DOCUMENTS

| | | | |
|---|---|---|---|
| 2008/0303064 A1* | 12/2008 | Sato | H01L 29/1029 257/194 |
| 2013/0099284 A1 | 4/2013 | Tserng et al. | |
| 2014/0092637 A1* | 4/2014 | Minoura | H01L 29/408 363/17 |
| 2015/0236121 A1* | 8/2015 | Chiu | H01L 29/66462 257/194 |

FOREIGN PATENT DOCUMENTS

| | | |
|---|---|---|
| JP | 2013-033877 | 2/2013 |
| JP | 2013-089970 | 5/2013 |

OTHER PUBLICATIONS

M. Khan "Metal Semiconductor Field Effect Transistor Based on Single Crystal GaN" Appl. Phys. Lett. 62 Apr. 1993 pp. 1786-1787.*

(Continued)

*Primary Examiner* — Asok K Sarkar
*Assistant Examiner* — Grant Withers
(74) *Attorney, Agent, or Firm* — Fujitsu Patent Center

(57) ABSTRACT

A semiconductor crystal substrate includes a substrate, a first semiconductor layer including a nitride semiconductor and formed over the substrate, a second semiconductor layer including a nitride semiconductor and formed over the first semiconductor layer, a first cap layer formed on the second semiconductor layer, and a second cap layer formed on the first cap layer. Each of the first semiconductor layer and the second semiconductor layer has a single-crystal structure, the first cap layer has one of a single-crystal structure and a polycrystalline structure, and the second cap layer has an amorphous structure.

10 Claims, 11 Drawing Sheets

(56) References Cited

OTHER PUBLICATIONS

AZoM article "Aluminium Gallium Nitride (AlGaN) Semiconductors" available online at www.azom.com/article.aspx?ArticleID=8466 dated Aug. 2013.*

Hirama, K. "AlGaN/GaN high-electron mobility transistors with low thermal resistance grown on single-crystal diamond (111) substrates by metalorganic vapor-phase epitaxy" Appl. Phys. Lett. 98 Apr. 2011 pp. 162112-1 through 162112-3).*

Brown, R. "A novel AlGaN/GaN based enhancement-mode high electron mobility transistor with sub-critical barrier thickness: Chapter 2 GaN High Electron Mobility Transistors" PhD thesis Univ. of Glasgow available online Jul. 31, 2015 pp. 15-39.*

* cited by examiner

SEMICONDUCTOR DEVICE AND METHOD THEREFOR INCLUDING MULTIPLE CAP LAYERS WITH AMORPHOUS LAYER

CROSS-REFERENCE TO RELATED APPLICATION

This application is based upon and claims the benefit of priority of Japanese Patent Application No. 2015-213395 filed on Oct. 29, 2015, the entire contents of which are incorporated herein by reference.

FIELD

An aspect of this disclosure relates to a semiconductor crystal substrate, a semiconductor device, a method for producing the semiconductor crystal substrate, and a method for producing the semiconductor device.

BACKGROUND

Application of nitride semiconductors having a high saturation electron velocity and a wide band gap to high-withstand-voltage, high-power semiconductor devices is being considered. For example, GaN, which is a nitride semiconductor, has a band gap of 3.4 eV that is greater than the band gap 1.1 eV of Si and the band gap 1.4 eV of GaAs, and has a high breakdown field strength. For this reason, a nitride semiconductor such as GaN is a very promising material for a high-voltage-operation, high-power semiconductor device for a power supply.

Many reports have been made on field effect transistors, particularly, high electron mobility transistors (HEMT), which are examples of semiconductor devices using nitride semiconductors. For example, as a GaN HEMT, an AlGaN/GaN HEMT, which uses GaN as an electron transit layer and AlGaN as an electron supply layer, is getting attention. In an AlGaN/GaN HEMT, distortion occurs in AlGaN due to a difference between the lattice constants of GaN and AlGaN. The distortion causes piezoelectric polarization and a spontaneous polarization difference of AlGaN, which in turn generate a high-density two-dimensional electron gas (2DEG).

Development of InAlN/GaN HEMTs using InAlN as the electron supply layer has been active in recent years. An InAlN/GaN HEMT has a performance that surpasses the performance of a HEMT using AlGaN as the electron transit layer. In an InAlN/GaN HEMT, the lattice matching between In and GaN can be achieved and a high-quality crystal film can be obtained by setting the composition ratio of In at 17 to 18%. Also, when InAlN is formed with such a composition ratio, the formed InAlN has very high spontaneous polarization. Therefore, an InAlN/GaN HEMT can generate a two-dimensional electron gas (2DEG) having a density that is two to three times greater than the density of the two-dimensional electron gas generated by an AlGaN/GaN HEMT using AlGaN as an electron transit layer. For the above reasons, HEMTs using InAlN as the electron supply layer are getting attention as next-generation high-power devices (see, for example, Japanese Laid-Open Patent Publication No. 2013-89970 and Japanese Laid-Open Patent Publication No. 2013-33877).

SUMMARY

According to an aspect of this disclosure, there is provided a semiconductor crystal substrate that includes a substrate, a first semiconductor layer including a nitride semiconductor and formed over the substrate, a second semiconductor layer including a nitride semiconductor and formed over the first semiconductor layer, a first cap layer formed on the second semiconductor layer, and a second cap layer formed on the first cap layer. Each of the first semiconductor layer and the second semiconductor layer has a single-crystal structure, the first cap layer has one of a single-crystal structure and a polycrystalline structure, and the second cap layer has an amorphous structure.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
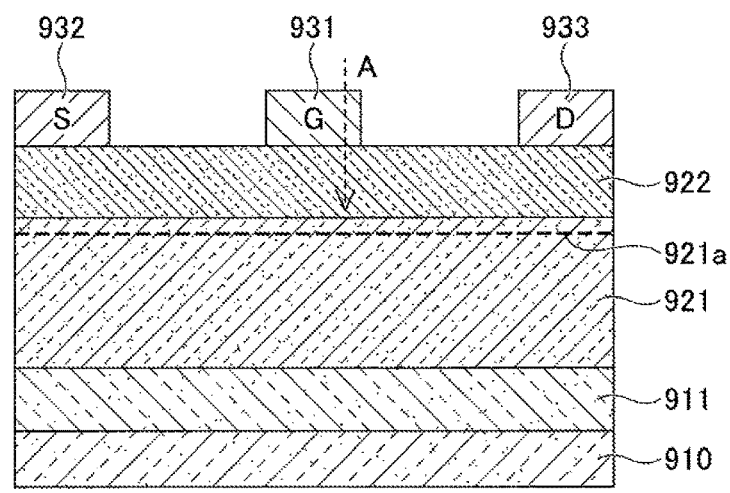
FIG. 1 is a drawing illustrating a gate leakage current in a semiconductor device.

Compared with GaAs HEMTs, AlGaN/GaN HEMTs and InAlN/GaN HEMTs have very high gate leakage currents. This is particularly true in the case of InAlN/GaN HEMTs.

Accordingly, there is a demand for a semiconductor device using nitride semiconductors and having a low gate leakage current.

Embodiments of the present invention are described below with reference to the accompanying drawings. The same reference numbers are assigned to the same components throughout the drawings, and repeated descriptions of those components are omitted.

First, a gate leakage current in a HEMT using nitride semiconductors is described. A HEMT of FIG. 1 includes a substrate 910, and a buffer layer 911, an electron transit layer 921, and an electron supply layer 922 that are stacked on the substrate 910 and include nitride semiconductors.

A gate electrode 931, a source electrode 932, and a drain electrode 933 are formed on the electron supply layer 922. The electron transit layer 921 is formed of GaN, and the electron supply layer 922 is formed of, for example, AlGaN or InAlN. In the HEMT with this configuration, a 2DEG 921a is generated in the electron transit layer 921 near the interface between the electron transit layer 921 and the electron supply layer 922. The electron density of the generated 2DEG 921a in the case where the electron supply layer 922 is formed of InAlN is greater than that in the case where the electron supply layer 922 is formed of AlGaN.

Figure 2:
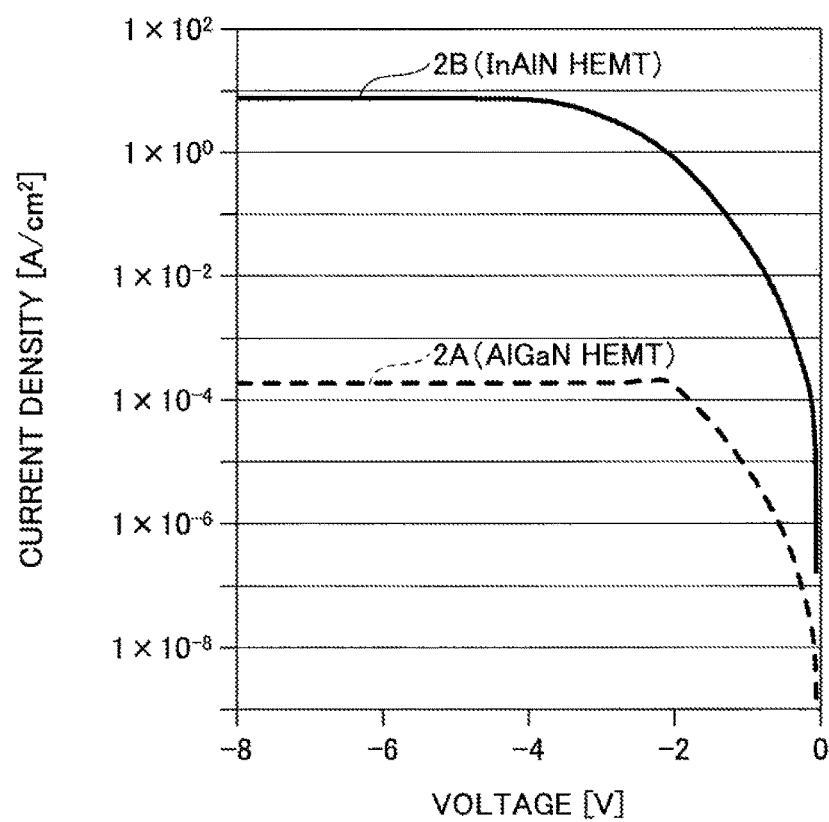
FIG. 2 is a graph illustrating characteristics of gate leakage currents in semiconductor devices.

A gate leakage current is generated when a negative voltage is applied to the gate electrode 931 with respect to the source electrode 932, and electrons flow from the gate electrode 931 in the direction indicated by an arrow A in FIG. 1. FIG. 2 is a graph illustrating a relationship between a gate voltage and the current density of a gate leakage current. In FIG. 2, a characteristic 2A indicates the characteristic of a HEMT including an electron supply layer formed of AlGaN, and a characteristic 2B indicates the characteristic of a HEMT including an electron supply later formed of InAlN. As illustrated in FIG. 2, the gate leakage current indicated by the characteristic 2B of the HEMT including the electron supply layer formed of InAlN is about five orders of magnitude greater than the gate leakage current indicated by the characteristic 2A of the HEMT including the electron supply layer formed of AlGaN. When the gate leakage current is large, the long-term reliability, the withstand voltage, and the operation efficiency of a device may be reduced.

Figure 3:
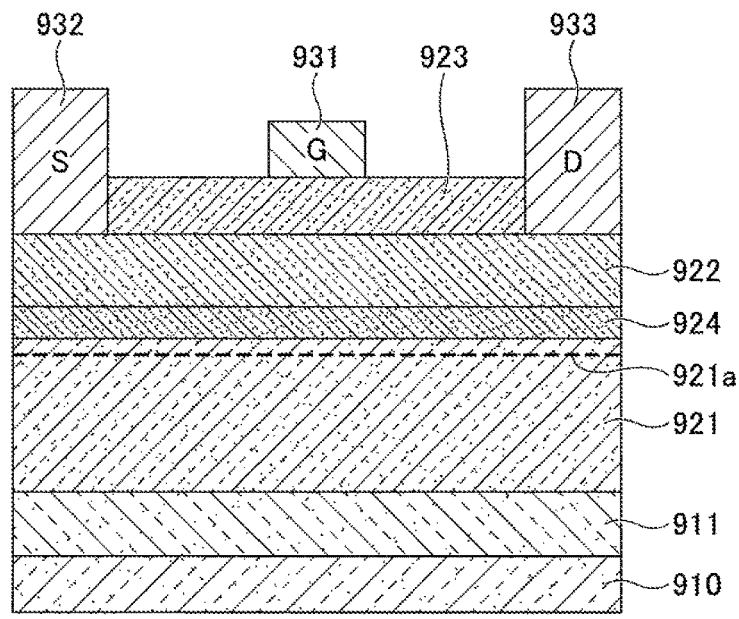
FIG. 3 is a drawing illustrating a configuration of a semiconductor device including a single-crystal AlN cap layer.

Crystalline AlN has a wide band gap and can function as an insulating film. In a semiconductor device illustrated by FIG. 3, a cap layer 923 is formed with single-crystal AlN on the electron supply layer 922 and the gate electrode 931 is formed on the cap layer 923 to reduce the leakage current. The semiconductor device of FIG. 3 also includes a spacer layer 924 between the electron transit layer 921 and the electron supply layer 922. The spacer layer 924 is formed of AlN, and the electron supply layer 922 is formed of InAlGaN.

Figure 4:
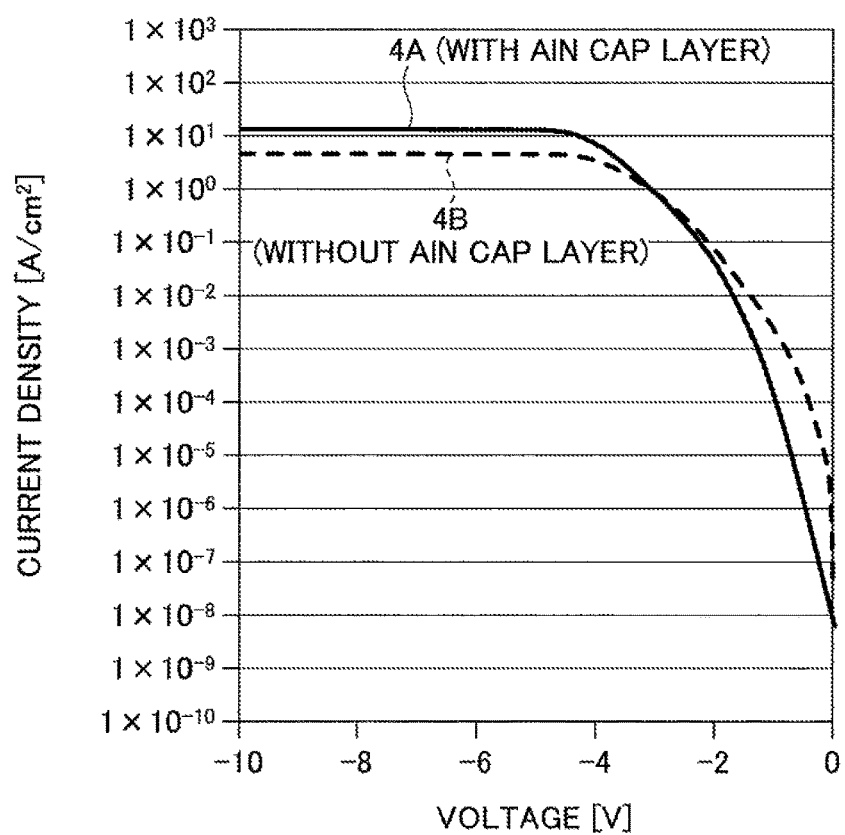
FIG. 4 is a graph illustrating characteristics of gate leakage currents in semiconductor devices.
Figure 5:
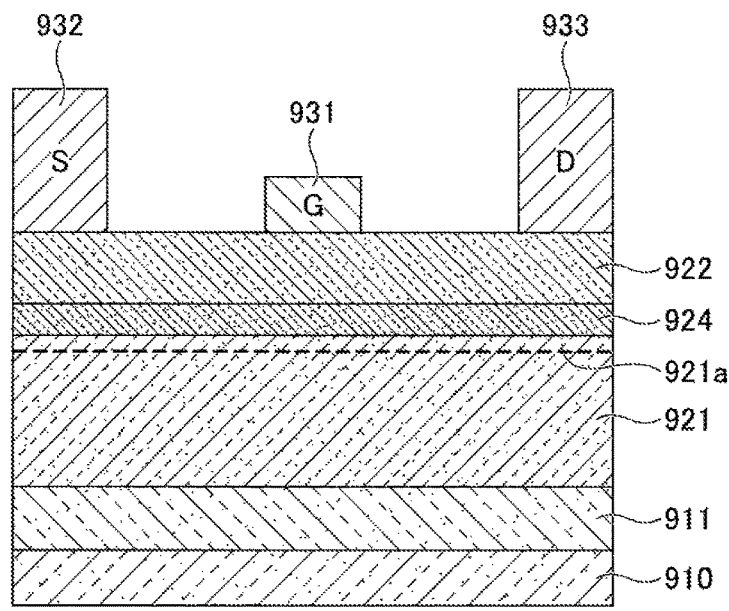
FIG. 5 is a drawing illustrating a configuration of a semiconductor device that does not include an AlN cap layer.

FIG. 4 is a graph illustrating a relationship between a gate voltage and the current density of a gate leakage current. In FIG. 4, a characteristic 4A indicates the characteristic of a HEMT including the cap layer 923 formed of single-crystal AlN, and a characteristic 4B indicates the characteristic of a HEMT including no cap layer. That is, the characteristic 4B indicates the characteristic of a HEMT having a configuration as illustrated by FIG. 5 where no cap layer is formed and the gate electrode 931 is formed on the electron supply layer 922. As illustrated by FIG. 4, the gate leakage current indicated by the characteristic 4A of the HEMT including the cap layer 923 formed of single-crystal AlN is not greatly different from the gate leakage current indicated by the characteristic 4B of the HEMT including no cap layer, and is even greater than the gate leakage current indicated by the characteristic 4B at a high voltage.

Figure 6:
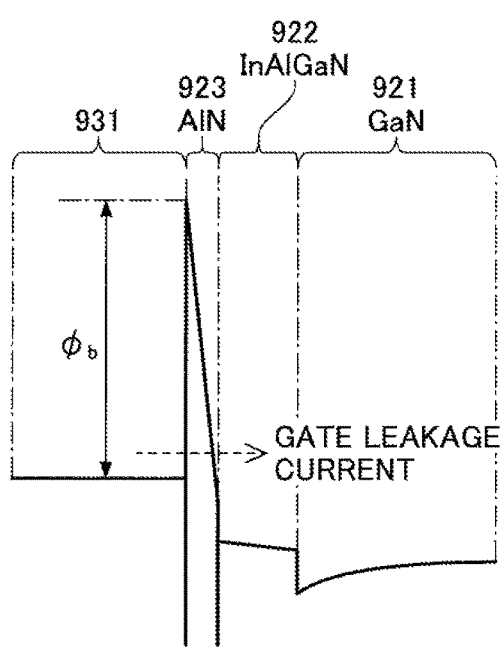
FIG. 6 is a drawing illustrating a band structure of a semiconductor device including a single-crystal AlN cap layer.

This is because when the cap layer 923 of single-crystal AlN is formed on the electron supply layer 922 of InAlGaN, the barrier performance of the cap layer 923 is reduced due to the polarization electric field. That is, when single-crystal AlN with a wide band gap is used for the cap layer 923, although a high Schottky barrier height $\varphi_b$ can be achieved as illustrated in FIG. 6, the barrier shape of the cap layer 923 is greatly distorted into a triangular shape due to an extremely strong polarization electric field. For this reason, the effective barrier performance of the cap layer 923 is greatly reduced. In single-crystal AlN, the polarization electric field increases due to strong spontaneous polarization of the single-crystal AlN itself, tensile distortion resulting from the single-crystalline structure of AlN, and piezoelectric polarization caused by the tensile distortion. Thus, the gate leakage current cannot be reduced by using the cap layer 923 formed of single-crystal AlN. FIG. 6 illustrates a band structure indicating the Fermi level of the gate electrode 931, the cap layer 923, and the bottoms of conduction bands of the electron supply layer 922 and the electron transit layer 921. In FIG. 6, the spacer layer 924 is omitted for brevity.

Figure 7:
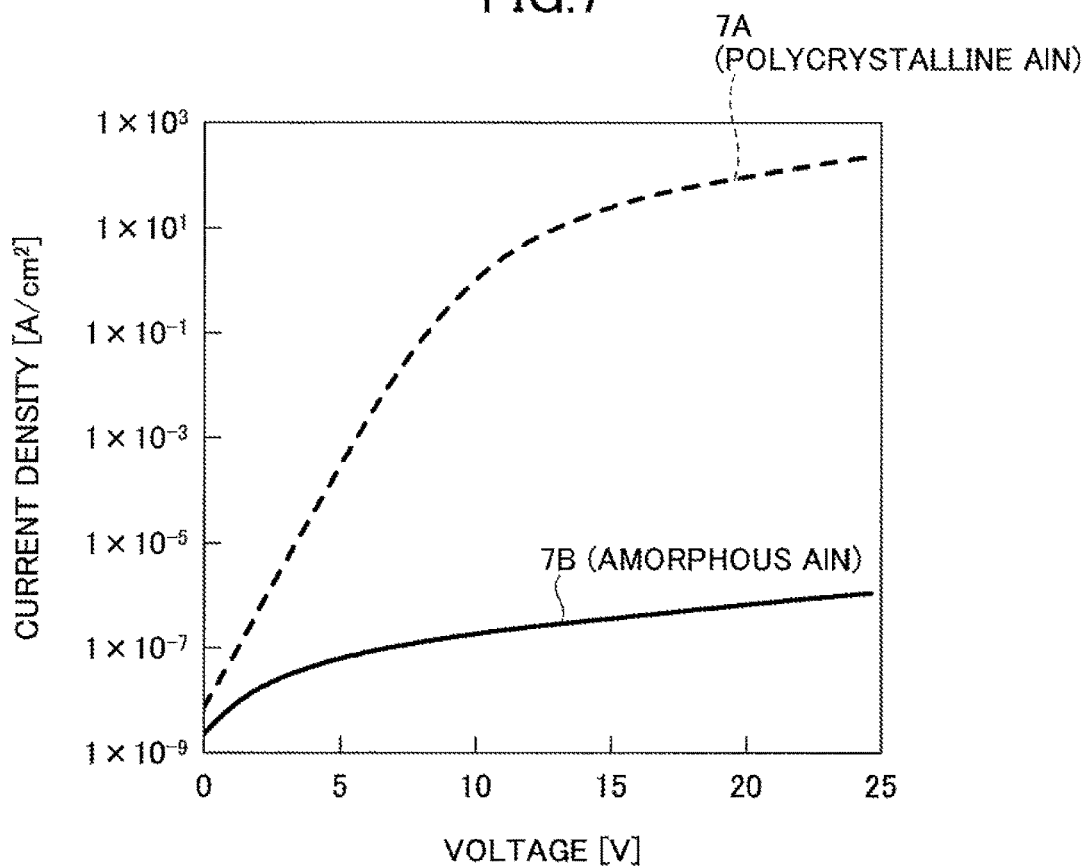
FIG. 7 is a graph illustrating a relationship between a voltage and a current density in each of a polycrystalline AlN film and an amorphous AlN film.

Next, the characteristics of polycrystalline AlN and amorphous AlN are described. FIG. 7 is a graph illustrating a relationship between a voltage and the current density of a current (leakage current) that flows when the voltage is applied in the film thickness direction to each of a polycrystalline AlN film and an amorphous AlN film. In FIG. 7, a characteristic 7A indicates the characteristic of the polycrystalline AlN film, and a characteristic 7B indicates the characteristic of the amorphous AlN film. As illustrated in FIG. 7, the current that flows through the polycrystalline AlN film indicated by the characteristic 7A is greater than the current that flows through the amorphous AlN film indicated by the characteristic 7B. For example, in a comparatively-high voltage range between 15 V and 25 V, the current that flows through the polycrystalline AlN film is about eight orders of magnitude greater than the current that flows through the amorphous AlN film. Thus, a larger amount of leakage current flows through the polycrystalline AlN film when a voltage is applied. This is supposed to be due to the presence of crystalline interfaces in polycrystalline AlN.

As described above, through experiments, the inventors of the present invention have found out that a cap layer needs to be formed of amorphous AlN to reduce the gate leakage current. However, when the cap layer 923 of amorphous AlN is formed directly on the electron supply layer 922 of single-crystal InAlGaN, defects tend to be formed at the interface between the electron supply layer 922 and the cap layer 923. This is due to the differences in materials and crystal structures between the electron supply layer 922 and the cap layer 923. That is, it is assumed that defects are formed because both the continuity of the crystal structure and the continuity of the material are broken at the interface between the electron supply layer 922 and the cap layer 923. If many defects are formed at the interface, electrons are trapped by the defects and a current collapse phenomenon tends to occur.

First Embodiment

<Semiconductor Device>

Figure 8:
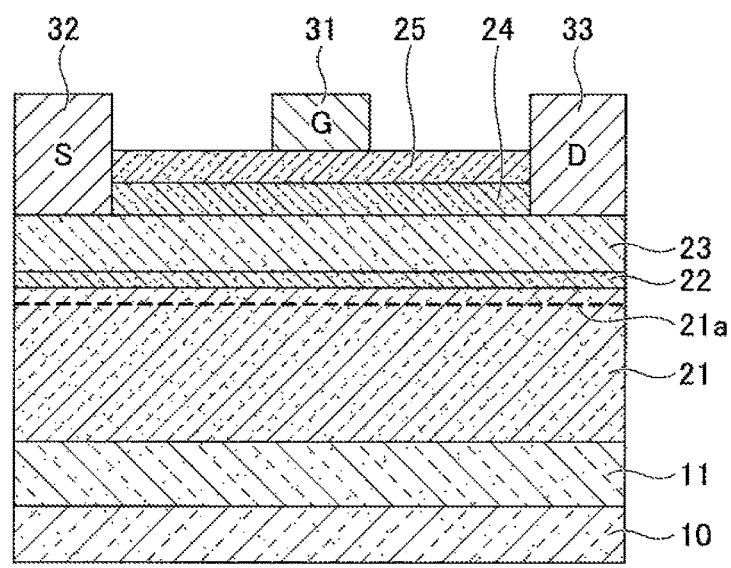
FIG. 8 is a drawing illustrating an exemplary configuration of a semiconductor device according to a first embodiment.

Next, a semiconductor device according to a first embodiment is described. As illustrated by FIG. 8, the semiconductor device of the first embodiment includes a substrate 10, and a nucleation layer (not shown), a buffer layer 11, an electron transit layer 21, a spacer layer 22, an electron supply layer 23, a first cap layer 24, and a second cap layer 25 that are formed on the substrate 10. A gate electrode 31 is formed on the second cap layer 25, and a source electrode 32 and a drain electrode 33 are formed on the electron supply layer 23. In the present application, a semiconductor crystal substrate may indicate a structure where the nucleation layer (not shown), the buffer layer 11, the electron transit layer 21, the spacer layer 22, the electron supply layer 23, the first cap layer 24, and the second cap layer 25 are formed on the substrate 10. Also in the present application, the electron transit layer 21 may be referred to as a "first semiconductor layer", the electron supply layer 23 may be referred to as a "second semiconductor layer", and the spacer layer 22 may be referred to as a "third semiconductor layer".

The substrate 10 may be implemented by an Si substrate. However, the substrate 10 may instead be formed of SiC, sapphire, or GaN. The nucleation layer may be formed of AlN and have a thickness of about 160 nm. The buffer layer 11 may be formed of AlGaN. The electron transit layer 21 may be formed of i-GaN and have a thickness of about 3 μm. The spacer layer 22 may be formed of AlN and have a thickness of about 1 μm. The electron supply layer 23 may be formed of InAlGaN and have a thickness of about 10 μm. The electron supply layer 23 may instead be formed of InAlN or AlGaN. With this configuration, a 2DEG 21a is generated in the electron transit layer 21 near the interface between the electron transit layer 21 and the spacer layer 22.

The first cap layer 24 may be formed of single-crystal or polycrystalline AlN and have a thickness of about 2 nm. The second cap layer 25 may be formed of amorphous AlN and have a thickness of about 4 nm. The thickness of the first cap layer 24 is preferably greater than or equal to 1 nm and less than or equal to 3 nm. The thickness of the second cap layer 25 is preferably greater than or equal to 2 nm and less than or equal to 5 nm. Also, the thickness of the second cap layer 25 is preferably greater than the thickness of the first cap layer 24. If the first cap layer 24 and the second cap layer 25 are too thick, their high frequency characteristics are reduced. Therefore, the thicknesses of the first cap layer 24 and the second cap layer 25 are preferably small. On the other hand, the first cap layer 24 and the second cap layer 25 need to have certain thicknesses so that the continuity of the crystal structure of the first cap layer 24 can be maintained and a desired insulation performance of the second cap layer 25 can be achieved. For these reasons, the thicknesses of the first cap layer 24 and the second cap layer 25 are preferably within the above ranges.

The first cap layer 24 may be formed of a material that has a band gap wider than the band gap of the electron supply layer 23 and has a single-crystal or polycrystalline structure. For example, the first cap layer 24 may be formed of an oxide, a nitride, or an oxynitride such as $Al_2O_3$, SiN, or $SiO_2$. The second cap layer 25 may be formed of a material that has a band gap wider than the band gap of the electron supply layer 23 and has an amorphous structure. For example, the second cap layer 25 may be formed of an oxide, a nitride, or an oxynitride such as $Al_2O_3$, SiN, or $SiO_2$. To maintain the continuity between the first cap layer 24 and the second cap layer 25, the first cap layer 24 and the second cap layer 25 are preferably formed of the same material. Also, the first cap layer 24 and the second cap layer 25 are preferably formed of AlN including elements that are the same as elements included in the electron supply layer 23.

Nitride semiconductor films including the nucleation layer (not shown), the buffer layer 11, the electron transit layer 21, the spacer layer 22, the electron supply layer 23, the first cap layer 24, and the second cap layer 25 are formed by metal organic chemical vapor deposition (MOCVD).

Figure 9:
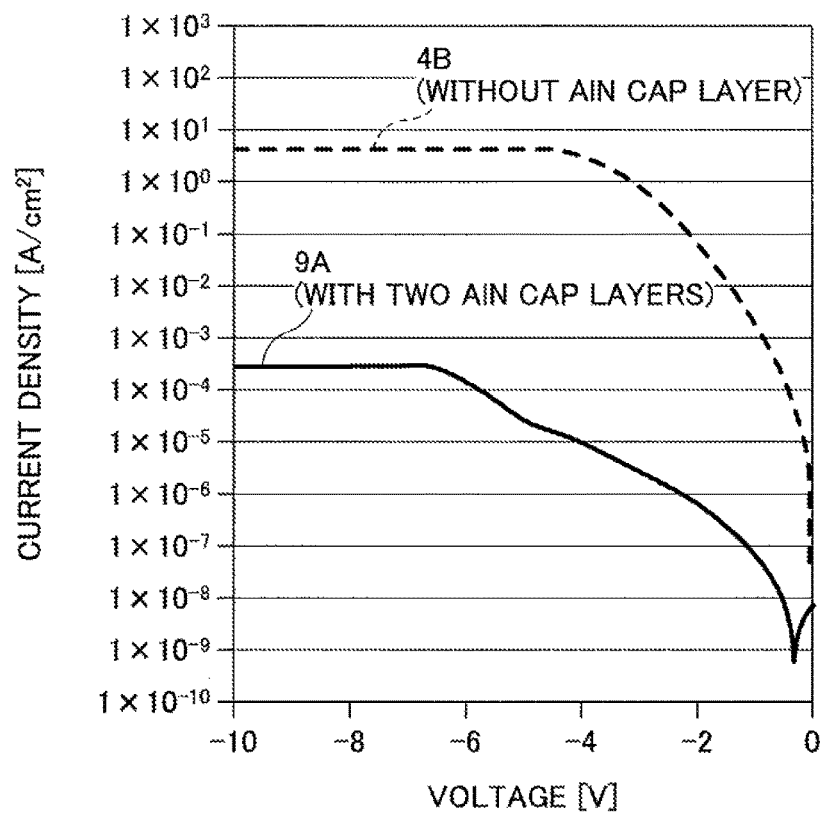
FIG. 9 is a graph illustrating characteristics of gate leakage currents in semiconductor devices of the first embodiment and a comparative example.

Next, a gate leakage current in the semiconductor device of the first embodiment is described. FIG. 9 is a graph illustrating a relationship between a gate voltage and the current density of a gate leakage current. In FIG. 9, a characteristic 9A indicates the characteristic of a HEMT that is the semiconductor device of the first embodiment, and a characteristic 4B indicates the characteristic of a HEMT of a comparative example that includes no cap layer. As illustrated in FIG. 9, the gate leakage current indicated by the characteristic 9A of the HEMT of the first embodiment is about four orders of magnitude less than the gate leakage current indicated by the characteristic 4B of the HEMT including no cap layer.

Figure 10:
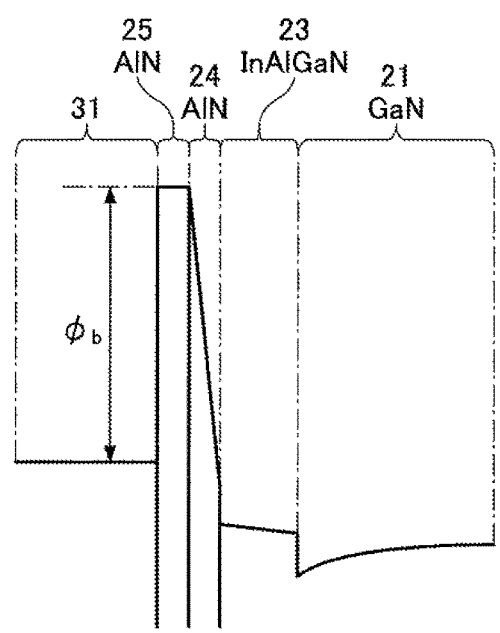
FIG. 10 is a drawing illustrating a band structure of a semiconductor device of the first embodiment.

This is because amorphous AlN forming the second cap layer 25 has a low crystal orientation, and both of spontaneous polarization and piezoelectric polarization disappear from the second cap layer 25. Accordingly, as illustrated in FIG. 10, the barrier shape of the second cap layer 25 is not greatly distorted into a triangular shape, and the original Schottky barrier height $\varphi_b$ of AlN is maintained. Thus, the second cap layer 25 can dramatically reduce the electron tunneling probability, and the gate leakage current of the semiconductor device of the first embodiment can be reduced. FIG. 10 illustrates a band structure indicating the Fermi level of the gate electrode 31, the second cap layer 25, the first cap layer 24, and the bottoms of conduction bands of the electron supply layer 23 and the electron transit layer 21. In FIG. 10, the spacer layer 22 is omitted for brevity.

Figure 11:
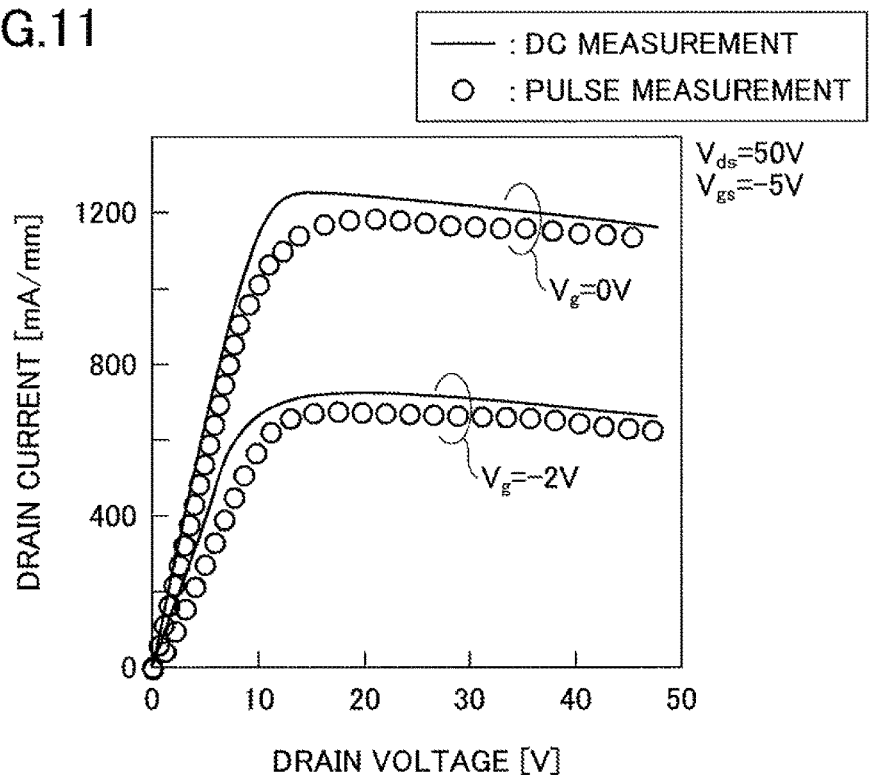
FIG. 11 is a graph illustrating a relationship between a drain voltage and a drain current of a semiconductor device of the first embodiment.
Figure 12:
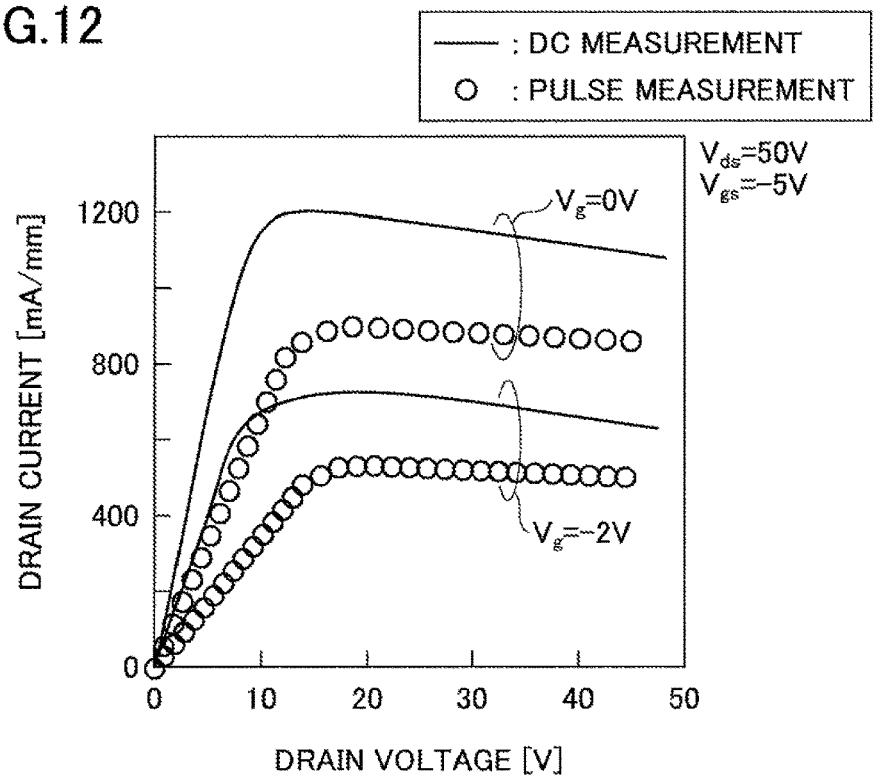
FIG. 12 is a graph illustrating a relationship between a drain voltage and a drain current of a semiconductor device that does not include an AlN cap layer.

Next, a current collapse phenomenon in the semiconductor device of the first embodiment is described. FIG. 11 is a graph illustrating a relationship ($I_{ds}$-$V_{ds}$ characteristics) between a drain voltage and a drain current of the semiconductor device of the first embodiment. FIG. 12 is a graph illustrating a relationship ($I_{ds}$-$V_{ds}$ characteristics) between a drain voltage and a drain current of the semiconductor device of FIG. 5 that includes no cap layer. FIGS. 11 and 12 illustrate the $I_{ds}$-$V_{ds}$ characteristics for each of the cases where a gate voltage $V_g$ is 0 V and −2 V. In FIGS. 11 and 12, a solid line indicates a characteristic obtained by direct-current voltage measurement (DC measurement) and ○ indicates a characteristic obtained by pulse measurement. In the pulse measurement, the characteristic is measured by instantaneously changing the voltage from a stress bias to a measurement voltage. The stress bias is set at "off stress", $V_{gs}$ is set at −5 V, and $V_{ds}$ is set at 50 V for the measurement. It can be determined that the current collapse phenomenon is more effectively suppressed as the difference between the current measured by the DC measurement and the current measured by the pulse measurement becomes smaller (the current measured by the pulse measurement is less than the current measured by the DC measurement).

As illustrated by FIG. 11, in the case of the semiconductor device of the first embodiment, the difference between the current measured by the DC measurement and the current measured by the pulse measurement is very small. On the other hand, as illustrated by FIG. 12, in the case of the semiconductor device of FIG. 5 including no cap layer, the difference between the current measured by the DC measurement and the current measured by the pulse measurement is large. Accordingly, compared with the semiconductor device of FIG. 5 including no cap layer, the current collapse phenomenon is more effectively suppressed in the semiconductor device of the first embodiment.

It is supposed that the current collapse phenomenon is suppressed because at least one of the continuity of the crystal structure and the continuity of the material is maintained at the interface between the electron supply layer 23 and the first cap layer 24 and at the interface between the first cap layer 24 and the second cap layer 25. That is, at the interface between the electron supply layer 23 and the first cap layer 24, although the continuity of the material is broken, the continuity of the crystal structure is maintained. Also, at the interface between the first cap layer 24 and the second cap layer 25, although the continuity of the crystal structure is broken, the continuity of the material is maintained. Maintaining at least one of the continuity of the crystal structure and the continuity of the material at an interface makes it possible to reduce defects formed at the interface, to greatly reduce electrons trapped by the defects, and to suppress the current collapse phenomenon.

<Method of Producing Semiconductor Device>

Next, an exemplary method of producing a semiconductor device according to the first embodiment is described with reference to FIGS. 13A through 14C. In the method of producing the semiconductor device of the first embodiment, nitride semiconductor films are formed by epitaxial growth on the substrate 10 such as a silicon substrate. The semiconductor device produced here includes nitride semiconductor films formed by MOCVD and also includes a passivation film. In forming nitride semiconductor films by MOCVD, trimethylindium (TMI) is used as a source gas for In, trimethylaluminum (TMA) is used as a source gas for Al, and trimethylgallium (TMG) is used as a source gas for Ga. Also, ammonia ($NH_3$) is used as a source gas for N.

Figure 13A:
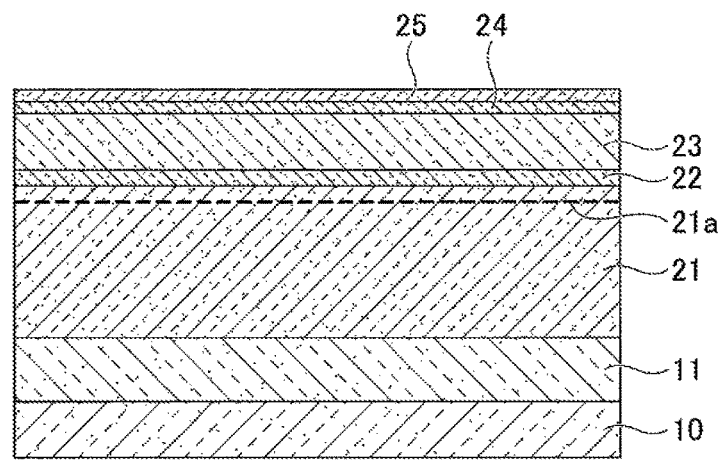
FIGS. 13A through 13C are drawings illustrating a method of producing a semiconductor device according to the first embodiment.

First, as illustrated by FIG. 13A, the nucleation layer (not shown), the buffer layer 11, the electron transit layer 21, the spacer layer 22, the electron supply layer 23, the first cap layer 24, and the second cap layer 25 are sequentially formed with nitride semiconductors on the substrate 10 such as a semi-insulating SiC substrate. As a result, a semiconductor crystal substrate of the first embodiment is produced.

The nucleation layer is formed by growing an AlN film with a thickness of about 160 nm under the conditions of a substrate temperature of about 1000° C., a V/III ratio between 1000 and 2000, and a pressure of about 50 Torr in the chamber of a MOCVD apparatus. At this step, TMA and $NH_3$ are supplied into the chamber of the MOCVD apparatus.

The buffer layer 11 is formed by growing an AlGaN film with a thickness of about 500 nm under the conditions of a substrate temperature of about 1000° C., a V/III ratio between 500 and 1000, and a pressure of about 50 Torr in the chamber of the MOCVD apparatus. At this step, TMA, TMG, and $NH_3$ are supplied into the chamber of the MOCVD apparatus. The buffer layer 11 may also be formed by stacking three AlGaN films with different composition ratios. For example, by adjusting the amounts of TMA and TMG supplied into the chamber, an $Al_{0.8}Ga_{0.2}N$ film, and $Al_{0.5}Ga_{0.5}N$ film, and an $Al_{0.2}Ga_{0.8}N$ film may be sequentially formed and stacked.

The electron transit layer 21 is formed by growing a GaN film with a thickness of about 3 μm under the conditions of a substrate temperature of about 1000° C., a V/III ratio between 500 and 3000, and a pressure of about 200 Torr in the chamber of the MOCVD apparatus. At this step, TMG and $NH_3$ are supplied into the chamber of the MOCVD apparatus.

The spacer layer 22 is formed by supplying TMA and $NH_3$ into the chamber of the MOCVD apparatus and thereby growing an AlN film with a thickness of about 1 nm.

The electron supply layer 23 is formed by growing an $In_{0.17}Al_{0.83}N$ film with a thickness of about 10 nm under the conditions of a substrate temperature between 680° C., and 750° C., a V/III ratio between 1000 and 3000, and a pressure of about 50 Torr in the chamber of the MOCVD apparatus. At this step, TMI, TMA, and $NH_3$ are supplied into the chamber of the MOCVD apparatus.

The first cap layer 24 is formed by growing an AlN film with a thickness of about 2 nm under the conditions of a substrate temperature between 680° C. and 750° C. and a pressure of about 50 Torr in the chamber of the MOCVD apparatus. The AlN film formed under these conditions has a single-crystal structure. At this step, TMA and $NH_3$ are supplied into the chamber of the MOCVD apparatus.

The second cap layer 25 is formed by growing an AlN film with a thickness of about 4 nm under the conditions of a substrate temperature between 400° C., and 500° C., and a pressure of about 50 Torr in the chamber of the MOCVD apparatus. The AlN film formed under these conditions has an amorphous structure. At this step, TMA and $NH_3$ are supplied into the chamber of the MOCVD apparatus.

In the first embodiment, the electron supply layer 23, the first cap layer 24, and the second cap layer 25 may be consecutively formed by crystal growth without taking the substrate 10 out of the chamber of the MOCVD apparatus. This method makes it possible to prevent contamination of the interface between the electron supply layer 23 and the first cap layer 24 and the interface between the first cap layer 24 and the second cap layer 25. That is, this method makes it possible to prevent the entry of, for example, C, O, and Si into the interfaces, and to prevent formation of defects at the interfaces. The second cap layer 25 may also be formed by atomic layer deposition (ALD).

In the semiconductor device of the first embodiment, although the electron supply layer 23 and the first cap layer 24 are formed of different materials, the continuity of the crystal structure is maintained because the electron supply layer 23 and the first cap layer 24 are formed by the same epitaxial growth. Accordingly, the defect density at the interface between the electron supply layer 23 and the first cap layer 24 is very low. Also, although the first cap layer 24 and the second cap layer 25 have different crystal structures, they are formed of the same material and the continuity of the material is maintained. Accordingly, the defect density at the interface between the first cap layer 24 and the second cap layer 25 is very low.

Figure 13B:
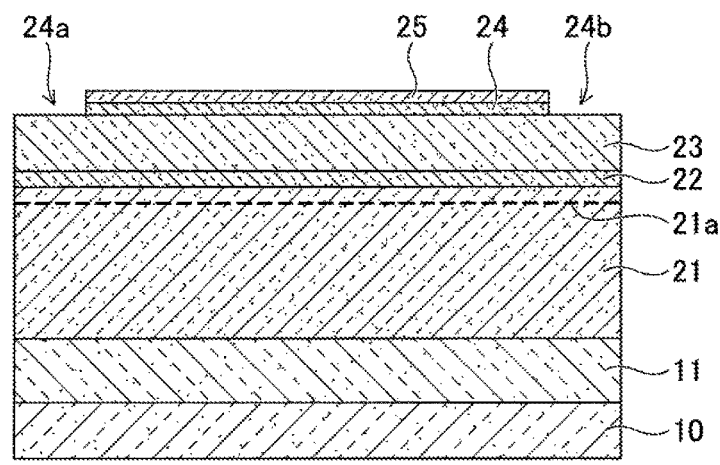

Next, as illustrated by FIG. 13B, portions of the first cap layer 24 and the second cap layer 25, which correspond to areas where the source electrode 32 and the drain electrode 33 are to be formed, are removed to form openings 24a and 24b that expose the electron supply layer 23. More specifically, a photoresist is applied to the second cap layer 25, and the photoresist is exposed and developed by an exposure apparatus to form a resist pattern (not shown) having openings in areas where the source electrode 32 and the drain electrode 33 are to be formed. Next, portions of the first cap layer 24 and the second cap layer 25 not covered by the resist pattern are removed by, for example, dry etching to expose portions of the electron supply layer 23 and form the openings 24a and 24b. Then, the resist pattern is removed by using, for example, an organic solvent.

Figure 13C:
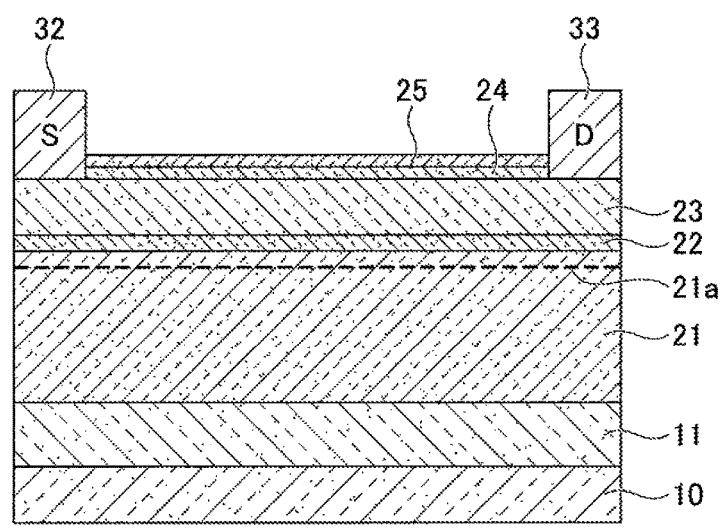

Next, as illustrated by FIG. 13C, the source electrode 32 and the drain electrode 33 are formed on the electron supply layer 23. More specifically, a photoresist is applied to the electron supply layer 23 and the second cap layer 25, and the photoresist is exposed and developed by an exposure apparatus to form a resist pattern (not shown) having openings in areas where the source electrode 32 and the drain electrode 33 are to be formed. Next, a metal laminated film including a Ti film (thickness: 20 nm) and an Al film (thickness: 200 nm) is formed by, for example, vacuum deposition, and the metal laminated film is immersed in an organic solvent to remove a portion of the metal laminated film formed on the resist pattern by a lift-off technique. The remaining portions of the metal laminated film including Ti and Al form the source electrode 32 and the drain electrode 33. Then, a heat treatment is performed on the source electrode 32 and the drain electrode 33 at a temperature between 400° C., and 1000° C., for example, at 550° C., to form ohmic contacts between the electron supply layer 23 and the source electrode 32 and the drain electrode 33.

Figure 14A:
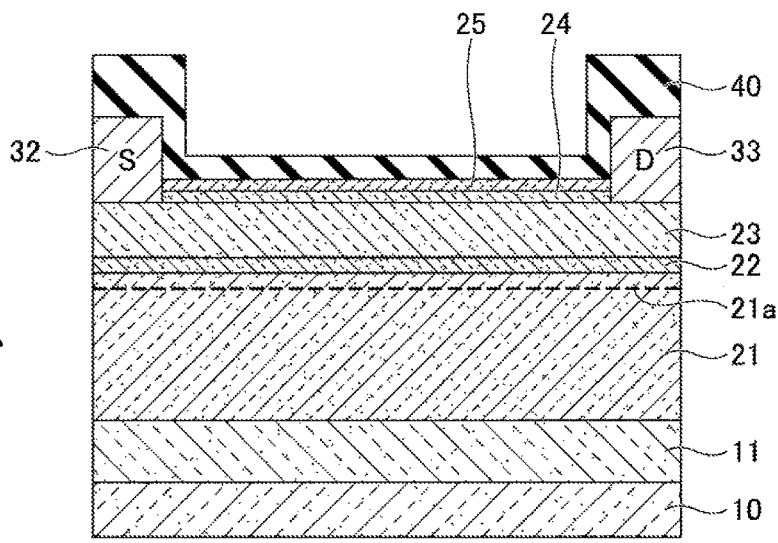
FIGS. 14A through 14C are drawings illustrating a method of producing a semiconductor device according to the first embodiment.

Next, as illustrated by FIG. 14A, a passivation film 40 is formed on the source electrode 32, the drain electrode 33, and the second cap layer 25. More specifically, the passivation film 40 with a thickness between 2 nm and 500 nm, for example, 100 nm, is formed by plasma chemical vapor deposition (CVD). The passivation film 40 may also be formed by ALD or sputtering. The passivation film 40 is preferably formed of an oxide, a nitride, or an oxynitride of Si, Al, Hf, Zr, Ti, Ta, or W, and is more preferably formed of SiN.

Figure 14B:
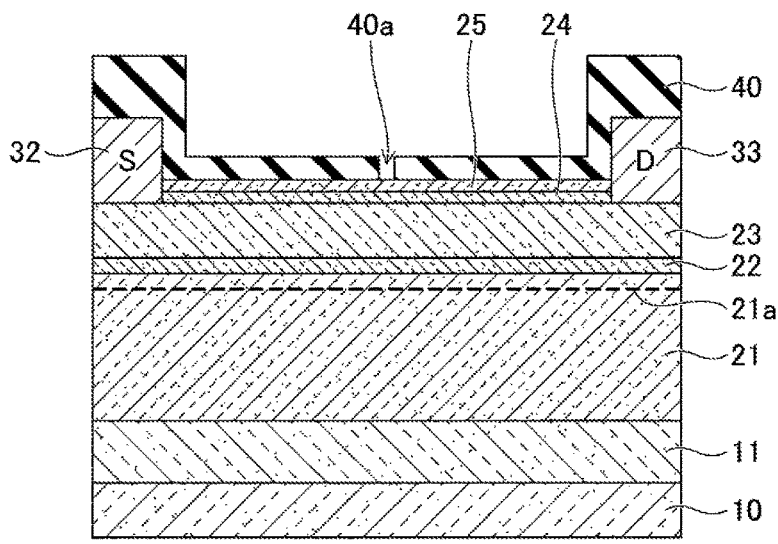

Next, as illustrated by FIG. 14B, a portion of the passivation film 40 in an area where the gate electrode 31 is to be formed is removed to form an opening 40a. More specifically, a photoresist is applied to the passivation film 40, and the photoresist is exposed and developed by an exposure apparatus to form a resist pattern (not shown) having an opening in an area where the opening 40a is to be formed. Next, a portion of the passivation film 40 not covered by the resist pattern is removed by dry etching using a chlorine gas or a fluorine gas as an etching gas to expose a portion of the second cap layer 25 and form the opening 40a. Then, the resist pattern is removed by using, for example, an organic solvent. Alternatively, the opening 40a of the passivation film 40 may be formed by wet etching using, for example, hydrofluoric acid or buffered hydrofluoric acid.

Figure 14C:
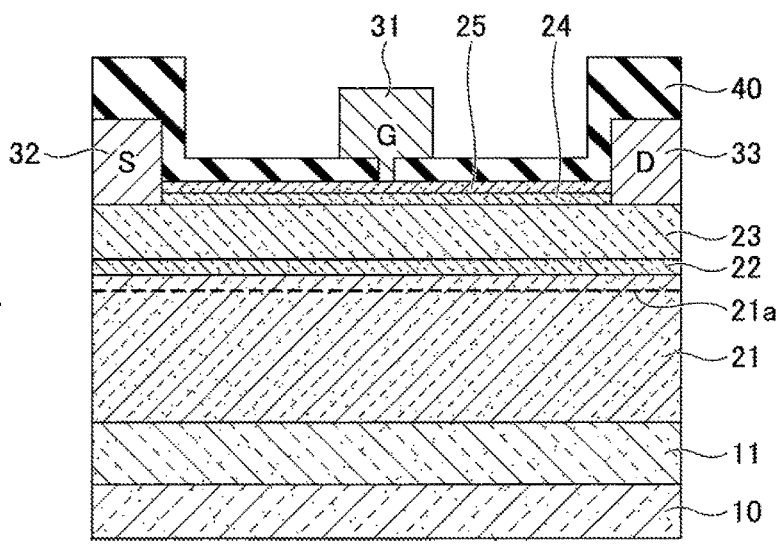

Next, as illustrated by FIG. 14C, the gate electrode 31 is formed on an area including the exposed portion of the second cap layer 25. More specifically, a photoresist is applied to the second cap layer 25 and the passivation film 40, and the photoresist is exposed and developed by an exposure apparatus to form a resist pattern (not shown) having an opening in an area where the gate electrode 31 is to be formed. Next, a metal laminated film including an Ni film (thickness: 30 nm) and an Au film (thickness: 400 nm) is formed by, for example, vacuum deposition, and the metal laminated film is immersed in an organic solvent to remove a portion of the metal laminated film formed on the resist pattern by a lift-off technique. The remaining portion of the metal laminated film including Ni and Au forms the gate electrode 31. Through the above process, the semiconductor device of the first embodiment is produced.

The layer structures of the gate electrode 31, the source electrode 32, and the drain electrode 33 illustrated in FIGS. 13A through 14C are just examples. Each of the gate electrode 31, the source electrode 32, and the drain electrode 33 may have a single-layer structure or a multilayer structure. Also, the gate electrode 31, the source electrode 32, and the drain electrode 33 may be formed by any other methods. In the first embodiment, a heat treatment is performed on the source electrode 32 and the drain electrode 33 after they are formed. However, the heat treatment may be omitted as long as ohmic characteristics are obtained. Also, a heat treatment may be performed on the gate electrode 31. Although the semiconductor device of the first embodiment employs a Schottky gate structure, a metal-insulator-semiconductor (MIS) gate structure may instead be used.

Although a semi-insulating SiC substrate is used as the substrate 10 in the first embodiment, any other type of substrate may also be used as long as nitride semiconductors are used for an epitaxial structure that functions as a field-effect transistor. Also, the substrate 10 may have either a semi-insulating property or a conductive property.

The above-described configuration of the semiconductor device is an example, and the semiconductor device may have any other appropriate configuration as a field-effect transistor. For example, a GaN or AlN cap layer may be formed as the uppermost layer of the semiconductor device. In the first embodiment, Si is used as an n-type impurity element. However, Ge or Sn may be used instead of Si.

Second Embodiment

Next, a second embodiment is described. In the second embodiment, a packaged semiconductor device, a power-supply device, and a high-frequency amplifier are described.

Figure 15:
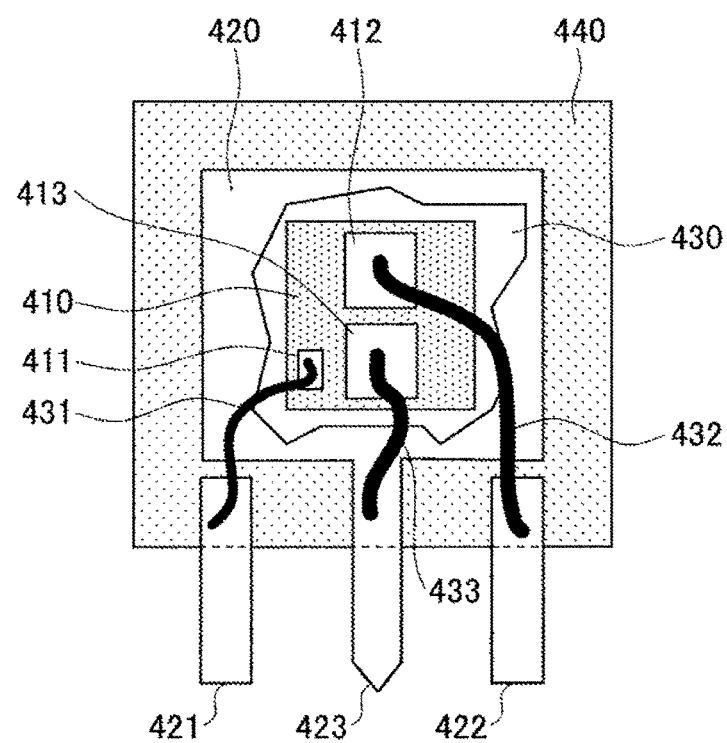
FIG. 15 is a drawing illustrating a discretely-packaged semiconductor device according to a second embodiment.

The packaged semiconductor device of the second embodiment is produced by discretely packaging the semiconductor device of the first embodiment. The discretely-packaged semiconductor device is described with reference to FIG. 15. FIG. 15 is a schematic diagram illustrating the internal configuration of the discretely-packaged semiconductor device. The arrangement of electrodes in the packaged semiconductor device is different from that in the semiconductor device of the first embodiment.

First, a semiconductor device is produced according to the first embodiment and is diced to obtain a semiconductor chip 410 that is a HEMT including a GaN semiconductor material. The semiconductor chip 410 is fixed to a lead frame 420 via a die attach material 430 such as solder. The semiconductor chip 410 corresponds to the semiconductor device of the first embodiment.

Next, a gate electrode 411 is connected via a bonding wire 431 to a gate lead 421, a source electrode 412 is connected via a bonding wire 432 to a source lead 422, and a drain electrode 413 is connected via a bonding wire 433 to a drain lead 423. The bonding wires 431, 432, and 433 are formed of a metal material such as Al. In the second embodiment, the gate electrode 411 is a gate electrode pad and is connected to the gate electrode 31 of the semiconductor device of the first embodiment. The source electrode 412 is a source electrode pad and is connected to the source electrode 32 of the semiconductor device of the first embodiment. The drain electrode 413 is a drain electrode pad and is connected to the drain electrode 33 of the semiconductor device of the first embodiment.

Then, the semiconductor chip 410 is sealed with a molding resin 440 by transfer molding. Through the above process, a discretely-packaged semiconductor device of a HEMT including a GaN semiconductor material is produced.

Next, a power-supply device and a high-frequency amplifier of the second embodiment are described. Each of the power-supply device and the high-frequency amplifier includes the semiconductor device of the first embodiment.

Figure 16:
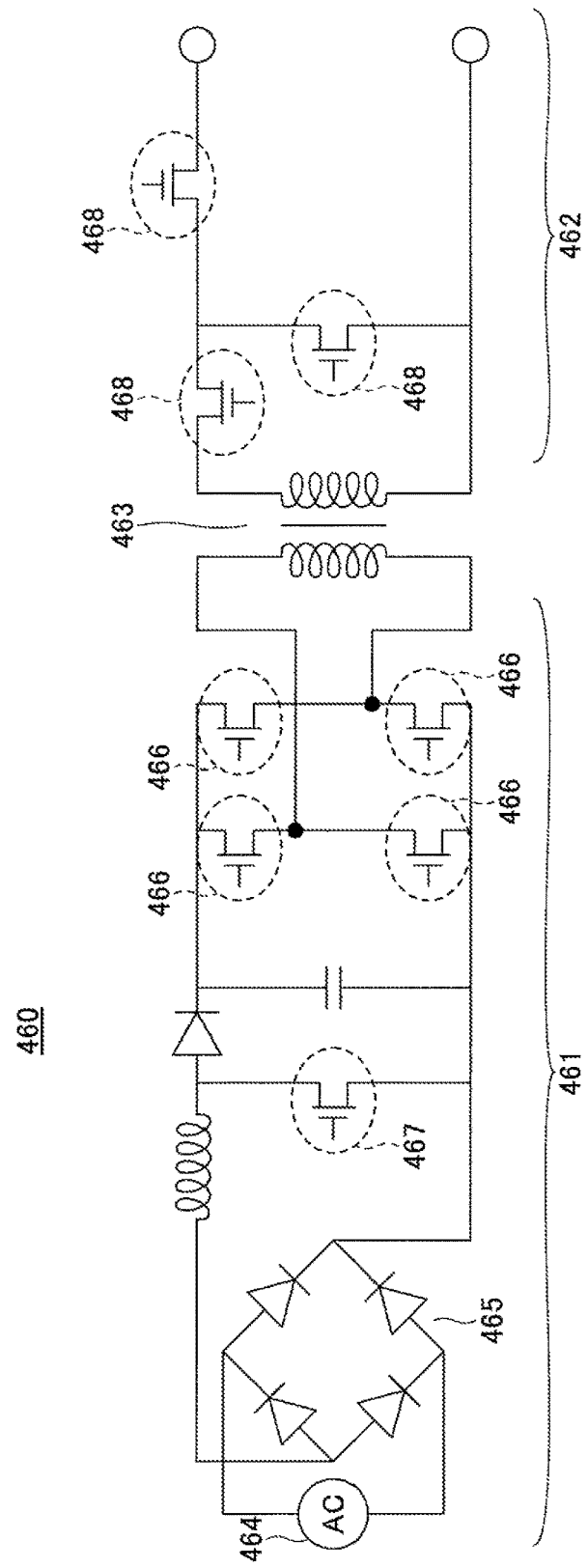
FIG. 16 is a circuit diagram of a power-supply device according to the second embodiment.

First, a power-supply device 460 of the second embodiment is described with reference to FIG. 16. The power-supply device 460 includes a high-voltage primary circuit 461, a low-voltage secondary circuit 462, and a transformer 463 disposed between the primary circuit 461 and the secondary circuit 462. The primary circuit 461 includes an alternator 464, a bridge rectifier circuit 465, multiple (in this example, four) switching elements 466, and a switching element 467. The secondary circuit 462 includes multiple (in this example, three) switching elements 468. In the example of FIG. 16, each of the switching elements 466 and 467 of the primary circuit 461 may be implemented by the semiconductor device of the first embodiment. Each of the switching elements 466 and 467 of the primary circuit 461 is preferably implemented by a "normally off" semiconductor device. Each of the switching elements 468 of the secondary circuit 462 may be implemented by a metal insulator semiconductor field effect transistor (MISFET).

Figure 17:
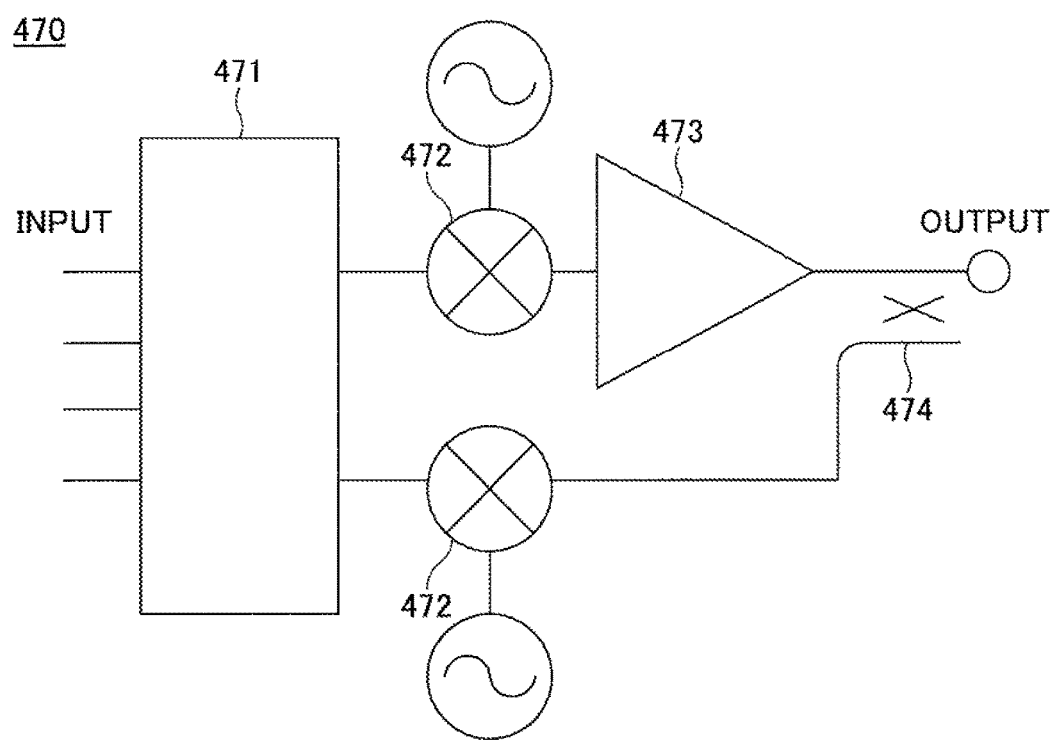
FIG. 17 is a drawing illustrating an exemplary configuration of a high-frequency amplifier according to the second embodiment.

Next, a high-frequency amplifier 470 of the second embodiment is described with reference to FIG. 17. The high-frequency amplifier 470 may be used, for example, for a power amplifier of a base station in a cell-phone system. The high-frequency amplifier 470 includes a digital predistortion circuit 471, mixers 472, a power amplifier 473, and a directional coupler 474. The digital predistortion circuit 471 compensates for the nonlinear distortion of an input signal. Each mixer 472 mixes the input signal whose nonlinear distortion is compensated for with an alternating current signal. The power amplifier 473 amplifies the input signal mixed with the alternating current signal. In the example of FIG. 17, the power amplifier 473 includes the semiconductor device of the first embodiment. The directional coupler 474, for example, monitors input signals and output signals. With the circuit of FIG. 17, for example, an output signal can be switched to the mixer 472 and mixed with an alternating-current signal, and the mixed signal can be output to the digital predistortion circuit 471.

An aspect of this disclosure provides a semiconductor crystal substrate that can reduces the gate leakage current of a semiconductor device.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
    a substrate;
    an electron transit layer including a nitride semiconductor and formed over the substrate;
    an electron supply layer including a nitride semiconductor and formed over the electron transit layer;
    a first cap layer formed on the electron supply layer;
    a second cap layer formed on the first cap layer;
    a source electrode formed over the electron supply layer;
    a drain electrode formed over the electron supply layer; and
    a gate electrode formed over the second cap layer, wherein
    each of the electron transit layer and the electron supply layer has a single-crystal structure;
    the electron supply layer includes a first surface facing the electron transit layer and a second surface opposite the first surface;
    the first cap layer and the second cap layer are formed entirely of a same type of material;
    the first cap layer has one of a single-crystal structure and a polycrystalline structure and is formed such that a first surface of the first cap layer directly contacts the second surface of the electron supply layer;
    the second cap layer has an amorphous structure and is formed such that a first surface of the second cap layer contacts a second surface of the first cap layer that is opposite the first surface of the first cap layer directly contacting the second surface of the electron supply layer; and
    the gate electrode directly contacts a second surface of the second cap layer that is opposite the first surface of the second cap layer.

2. The semiconductor device as claimed in claim 1, wherein the first cap layer and the second cap layer are formed of one of an oxide, a nitride, and an oxynitride.

3. The semiconductor device as claimed in claim 1, wherein the first cap layer and the second cap layer are formed of a material including AlN.

4. The semiconductor device as claimed in claim 1, wherein a thickness of the first cap layer is greater than or equal to 1 nm and less than or equal to 3 nm.

5. The semiconductor device as claimed in claim 1, wherein a thickness of the second cap layer is greater than or equal to 2 nm and less than or equal to 5 nm.

6. The semiconductor device as claimed in claim 1, wherein a thickness of the second cap layer is greater than a thickness of the first cap layer.

7. The semiconductor device as claimed in claim 1, wherein
    the electron transit layer is formed of a material including GaN; and
    the electron supply layer is formed of a material including one of InAlN and InAlGaN.

8. A power-supply device comprising the semiconductor device of claim 1.

9. An amplifier comprising the semiconductor device of claim 1.

10. A manufacturing method of a semiconductor device, comprising:
    forming an electron transit layer including a nitride semiconductor and having a single-crystal structure over a substrate;
    forming an electron supply layer including a nitride semiconductor and having a single-crystal structure over the electron transit layer;
    forming a first cap layer having one of a single-crystal structure and a polycrystalline structure on the electron supply layer;
    forming a second cap layer having an amorphous structure on the first cap layer;
    forming a source electrode over the electron supply layer;
    forming a drain electrode over the electron supply layer; and
    forming a gate electrode over the second cap layer, wherein
    the electron supply layer includes a first surface facing the electron transit layer and a second surface opposite the first surface;

the first cap layer and the second cap layer are formed entirely of a same type of material;

the first cap layer is formed such that a first surface of the first cap layer directly contacts the second surface of the electron supply layer;

the second cap layer is formed such that a first surface of the second cap layer contacts a second surface of the first cap layer that is opposite the first surface of the first cap layer directly contacting the second surface of the electron supply layer; and the gate electrode is formed to directly contact a second surface of the second cap layer that is opposite the first surface of the second cap layer.

* * * * *